(12) United States Patent
Yan et al.

(10) Patent No.: US 6,847,048 B2
(45) Date of Patent: Jan. 25, 2005

(54) ORGANIC THIN FILM TRANSISTOR (OTFT)

(75) Inventors: Donghang Yan, Changchun (CN);
Jianfeng Yuan, Changchun (CN)

(73) Assignee: Changchun Institute of Applied Chemistry Chinese Academy of Science (CN)

( * ) Notice: Subject to any disclaimer, the term of this patent is extended or adjusted under 35 U.S.C. 154(b) by 0 days.

(21) Appl. No.: 10/618,544

(22) Filed: Jul. 11, 2003

(65) Prior Publication Data
US 2004/0056246 A1 Mar. 25, 2004

(30) Foreign Application Priority Data
Sep. 23, 2002 (CN) .................................... 02 13 0962 A

(51) Int. Cl.$^7$ ......................... H01L 35/24; H01L 29/76
(52) U.S. Cl. ............................. 257/40; 257/59; 257/72; 257/258; 257/291; 257/406
(58) Field of Search ........................ 257/40, 288, 368, 257/405, 406, 410, 411, 59, 72, 82, 258, 291, 292, 294

(56) References Cited
U.S. PATENT DOCUMENTS
2002/0014624 A1 * 2/2002 Yamazaki et al. ............ 257/57

FOREIGN PATENT DOCUMENTS
CN 1293825 A 2/2001
WO WO 99/40631 8/1999

OTHER PUBLICATIONS

Klauk et al., "A reduced complexity process for organic thin film transistors" (2000) applied physics letters, vol. 76, No. 13, pp. 1692–1694.*

C. D. Dimitrakopoulos, et al., "Low–Voltage Organic Transistors on Plastic Comprising High–Dielectric Constant Gate Insulators" (1999) Science Vo. 283, pp. 822–824.

H. Klauk et al., "A Reducted Complexity Process for Organic Thin Film Transistors" (2000) Applied Physics Letters, vol. 76, No. 13, pp. 1692–1694.

* cited by examiner

*Primary Examiner*—Minhloan Tran
*Assistant Examiner*—Tan Tran

(57) ABSTRACT

The present invention relates to an organic thin film transistor (OTFT) comprising: a substrate (1), a gate electrode (2) formed on the substrate (1), a gate insulation layer formed on the gate electrode, a source electrode (5) and a drain electrode (6) formed on the gate insulation layer including a first insulation layer (3) and a second insulation layer (4) with different dielectric constants, and an active layer (7) which overlays the source electrode (5) and the drain electrode (6). Without adding the conventional complicated processes like photolithography but adding two simple processes of spin coating or vaporously coating the second insulation film and self-aligned dry RIE, the present invention not only can improve the carrier's injection property so as to improve the OTFT device's properties, but also can block the leakage current of the gate insulation layer and reduce the device's parasitic capacitance. Therefore, the material with high dielectric constant can be used as the insulation layer to increase the channel capacitance so as to reduce threshold voltage of the device and reduce the adverse effect of the leakage between the source and gate electrodes, the gate and drain electrodes.

17 Claims, 7 Drawing Sheets

ORGANIC THIN FILM TRANSISTOR (OTFT)

BACKGROUND OF THE INVENTION

1. Field of the Invention

The present invention relates to a kind of organic thin film transistor (to be abbreviated as OTFT hereinafter) and a manufacturing method thereof.

2. Description of the Related Art

In recent years, the performances of the OTFT have been continuously improved. The carrier mobility of some transistors made of such organic materials as Pentacene, Oligothiophene, Tetracene and so on is over 1 $cm^2/V.s$, therefore, these transistors are potential in such practical applications as active matrix display, flexural integrated circuit (to be abbreviated as IC hereinafter) and so on. Because the organic semiconductor materials are sensitive to some chemical solvents generally used in the traditional process of photolithography, it is comparatively difficult to deal with this kind of device's fine finish. At present, the method of setting the organic semiconductor layer above the source/drain electrode (generally referred to bottom electrode OTFT, please see FIG. 1) is usually adopted to avoid the problem of fine finish to the device's FIGURE. But this kind of device's channel on-state current is lower than that of the device whose organic semiconductor layer is set under the source/drain electrode (referred to top electrode OTFT, please see FIG. 2). In a word, form the point view of structure, the top electrode device is superior to the bottom electrode one (please turn to FIGS. 3 and 4 to see the comparison). In addition, by far threshold voltage of the OTFT is a little higher. The threshold voltage can be affected by many factors, such as, for example, the interface behavior of the organic layer and the insulation layer, the contact performance between the source/drain electrode and the organic semiconductor, etc. The available method of effectively reducing the threshold voltage is to reduce the thickness of the insulation film or to use the material with high dielectric constant (e.g. barium titanate, BZT) as the insulation layer (C. D. Dimitrakopoulos et al *Science* 283, 822, 1999). Unfortunately, all the two methods increase the leakage current between the gate electrode and the source electrode, between the gate electrode and the drain electrode. The main reason is that the material with high dielectric constant is poor in insulatibity. In recent years, the Chinese Patent Application CN 1293825A discloses a kind of transistor (including the inorganic and organic ones) having a upstanding configuration, and the Jackson research group in Pennsylvanian State University also discloses a method for simplifying the OTFT structure (*Appl. Phys. Lett.* 2000, 76: 1692–1694). However, neither of the above two methods can solve the above-mentioned problems.

SUMMARY OF THE INVENTION

The present invention aims at providing a high performance OTFT device which can effectively reduce the leakage current between the gate electrode and the source electrode, between the gate electrode and the drain electrode.

Another objective of the present invention is to provide a method of producing high performance OTFT.

According to one aspect of the invention, to achieve the above-mentioned objectives, the present invention provides an OTFT comprising:

a substrate (1), a gate electrode (2) formed on the substrate (1), a gate insulation layer formed on the gate electrode (2) and including a first insulation layer (3) and a second insulation layer (4) having different dielectric constants, a source electrode (5) and a drain electrode (6) formed on the gate insulation layer, and an active layer (7) formed on the source electrode (5) and the drain electrode (6).

According to another aspect of the present invention, there is provided a method for producing the OTFT comprising:

Step 1: sputtering or vaporizing a layer of metal (such as Ta, Ti, W, MO and so on) on the substrate and forming it into a gate electrode with the method of photolithography (see FIG. 6.(*a*));

Step 2: sputtering or vaporizing a gate insulation film (such as $Ta_2O_5$, $Al_2O_3$, $TiO_2$, BZT and so on) or spin coating a layer of polymer (such as poly(methyl methacrylate), polyimide, polyvinyl alcohol, polyvinylidene fluoride and so on), or sputtering or vaporizing an inorganic film (such as $SiO_2$, $SiN_x$ and so on) with low dielectric constants as the dual-gate insulation film (see FIG. 6.(*b*));

Step 3: forming a layer of metal (such as Au, Ag, Mo, Al and so on) with the method of vacuous heat evaporation, then forming it into a source electrode and a drain electrode respectively with the method of photolithography (see FIG. 6.(*c*));

Step 4: removing the second insulation film in the channel with the method of reactive ion etching (RIE) in dry process using the source and drain electrodes as the mask (see FIG. 6.(*d*)); and Step 5: forming an active layer by vacuous heat evaporating an organic semiconductor material, and then shaping it with the method of photolithography and RIE.

Without adding the conventional complicated processes like photolithography but adding two simple processes of spin coating or vaporously coating the second insulation film and self-aligned dry RIE, the present invention not only can improve the carrier's injection property so as to improve the OTFT device's properties, but also can block the leakage current of the gate insulation layer and reduce the device's parasitic capacitance. Therefore, the material with high dielectric constant can be used as the insulation layer to increase the channel capacitance so as to reduce threshold voltage of the device and reduce the adverse effect of the leakage between the source and gate electrodes, the gate and drain electrodes.

Herein, "Pc" represents "phthalocyanine" and "Nc" represents "Naphthocyanine".

DETAILED DESCRIPTION OF THE PREFERRED EMBODIMENTS

Figure 1:
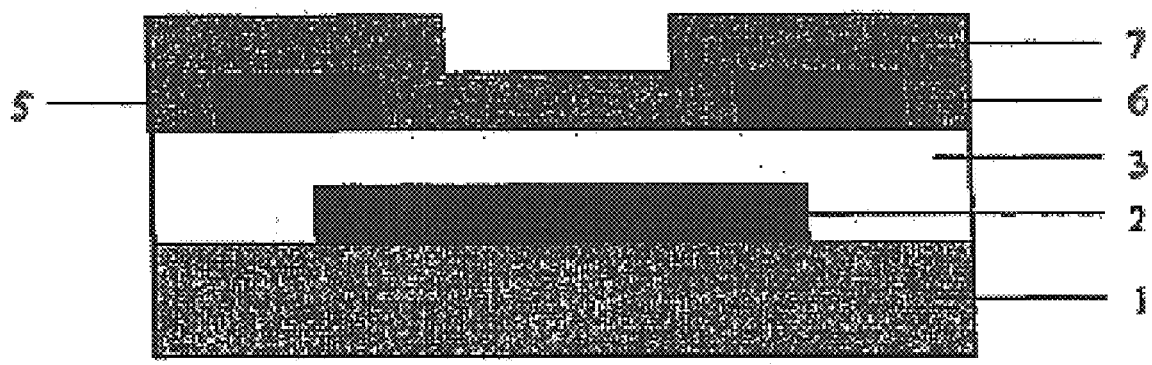
FIG. 1 is a schematic section view of the conventional bottom electrode OTFT device.
Figure 2:
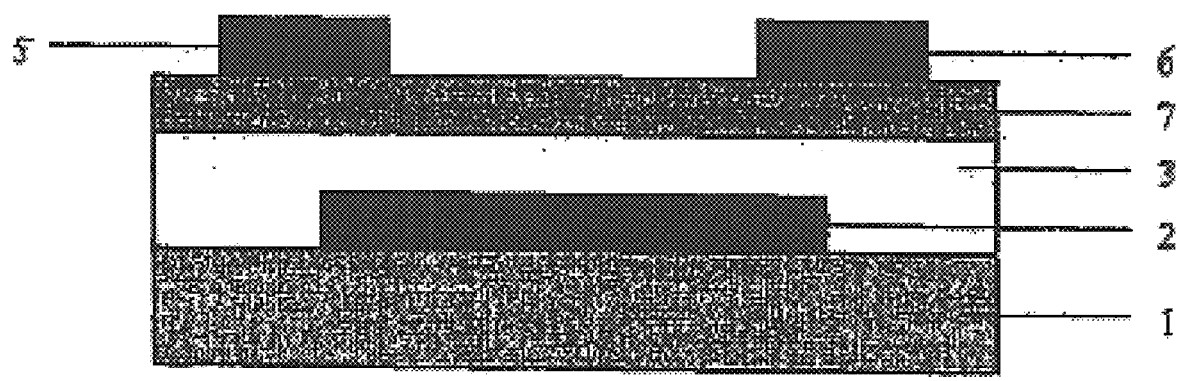
FIG. 2 is a schematic section view of the conventional top electrode OTFT device.
Figure 3:
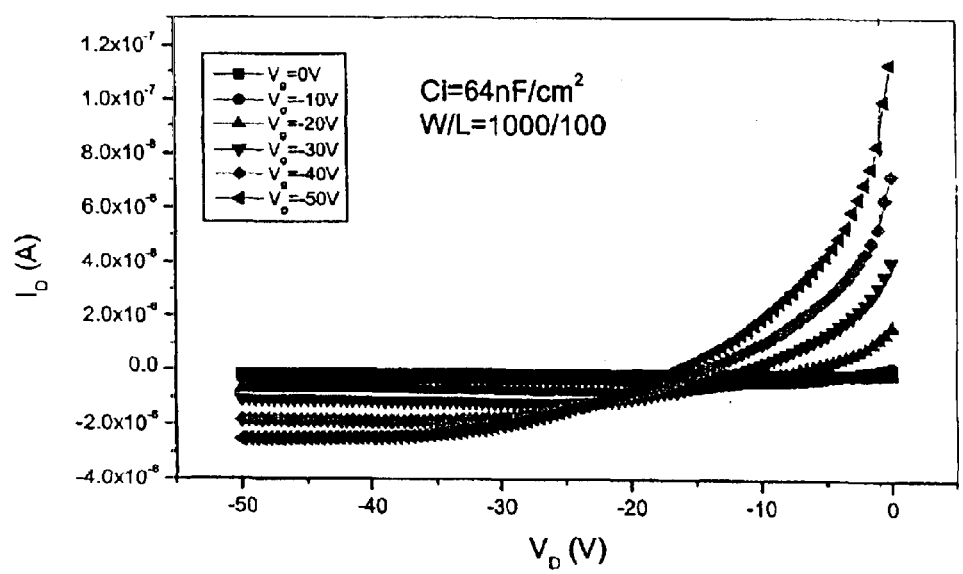
FIG. 3 shows the output characteristic curve of the bottom electrode OTFT.
Figure 4:
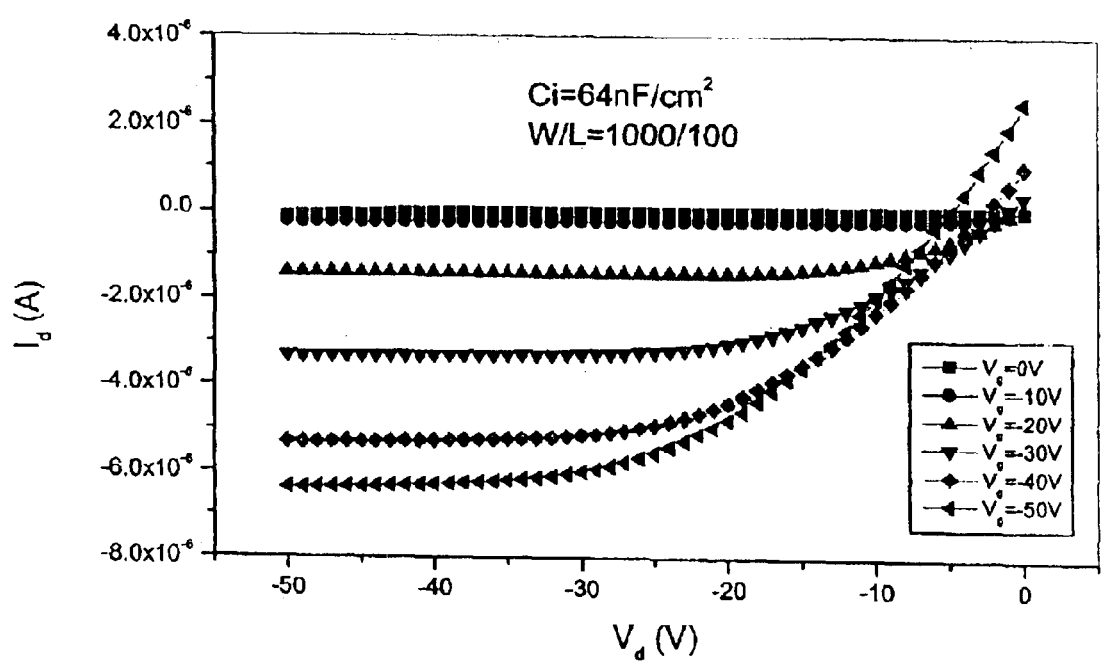
FIG. 4 shows the output characteristic curve of the top electrode OTFT.
Figure 5:
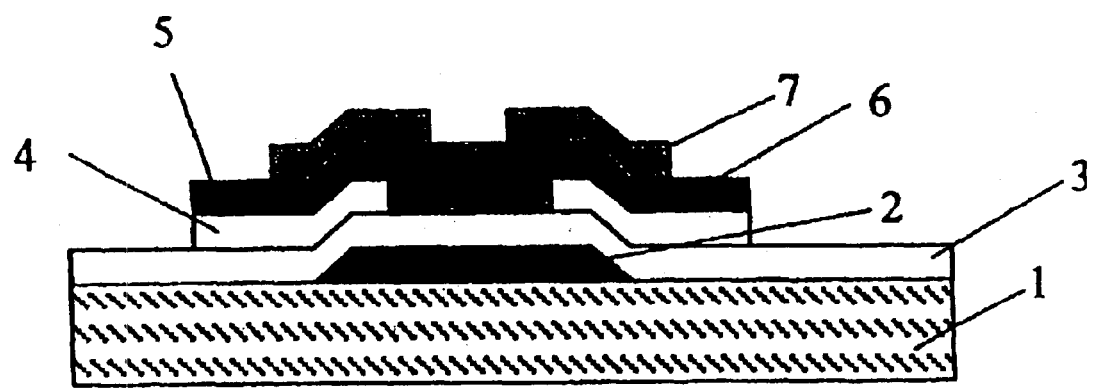
FIG. 5 is a schematic section view of one OTFT device according to the present invention.

As shown in FIG. 5, a layer of metal film was sputtered or vaporized on the substrate (1) and formed and shaped into the gate electrode (2) with the method of photolithography. A layer of organic, or inorganic, or ferroelectric material was sputtered on-the photolithography electrode as the first insulation layer (3), then a layer of organic high molecular material or inorganic material was sputtered on this insulation layer (3) as the second insulation layer (4). The dielectric constant of the first insulation layer (3) is not the same as that of the second one (4). In general, the former is at least four times higher than the latter. In succession, the source electrode (5) and the drain electrode (6), both with 1000 micro meters in the channel's width and 100 micro meters in the channel's length, were formed on the second insulation layer (4). Then, a semiconductor active layer was formed on the first insulation layer (3), the source electrode (5) and the drain electrode (6). The device according to the present invention adopted a structure in which the insulation material with high dielectric constant was used to form the gate insulation film and the material with low dielectric constant was placed under the source/drain electrode to support it higher. In this way, the on-state current can be enlarged and the threshold voltage of the transistor can be reduced. Meanwhile, the leakage current between the gate electrode and the source electrode, between the gate electrode and the drain electrode can be reduced so as to reduce the parasite capacitance here. Therefore, the distance between the channel region near the source electrode and the source electrode is enlarged so that the relative electric potential of the source electrode relative to the channel region is enhanced. This structure is in favor of the carrier's injection into the channel region from the source electrode and the drain electrode, thus, the performance of OTFT is improved greatly.

EXAMPLE 1

Figure 6:
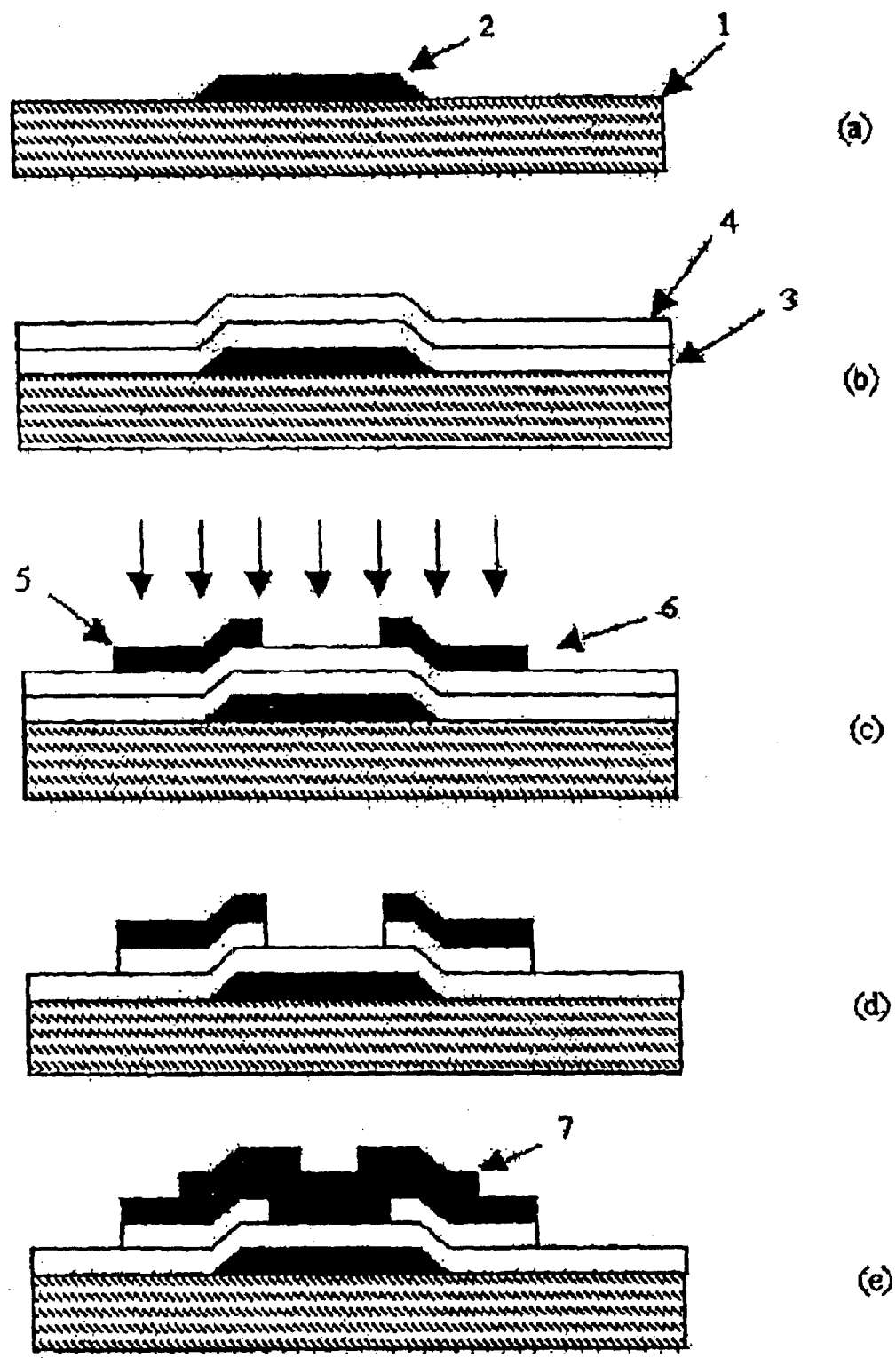
FIG. 6 is the process flow diagram of one OTFT device according to the electrode structure of the present invention.
Figure 7:
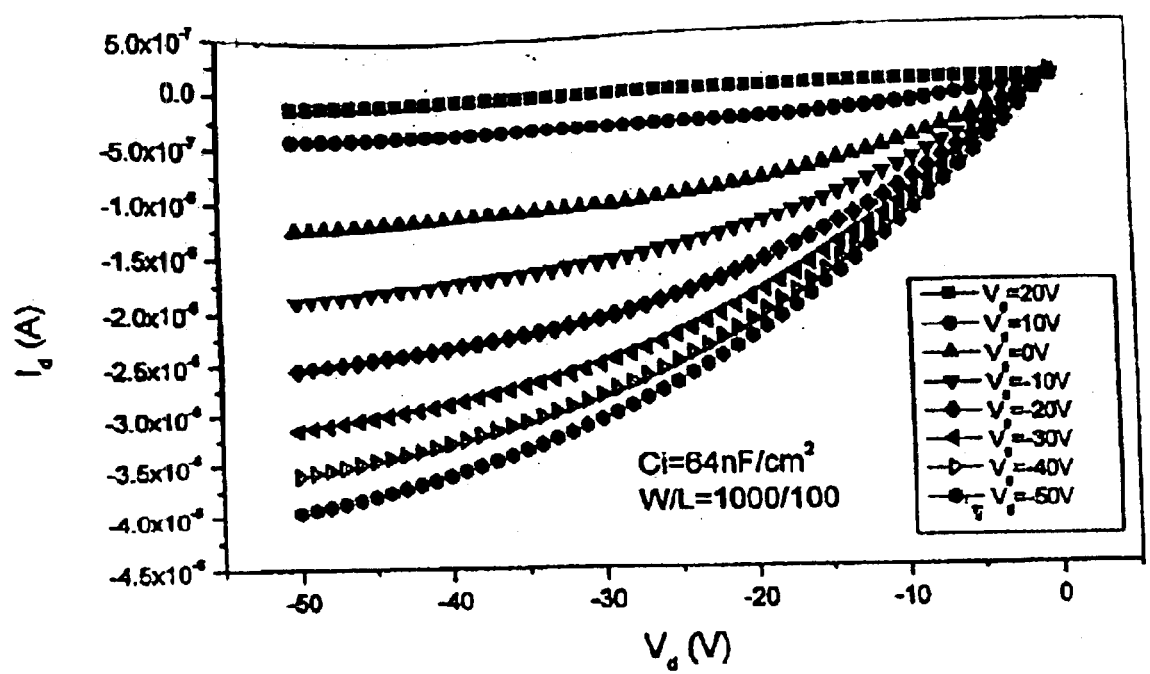
FIG. 7 shows the output characteristic curve of one OTFT device made by the present invention.

As shown in FIG. 6, a layer of metal Ta was plated on a 7059 glass substrate (1) by the RF magnetism controlled sputtering method. The sputtering conditions were as follows: a background vacuum of $2\times10^{-3}$ Pa; a Ar pressure of 1 Pa; a RF power of 500 W; and a substrate temperature of 100 centigrade. Then the layer of metal Ta was shaped into the gate electrode (2) by the photolithography method. A layer of $Ta_2O_5$ 400 nm in thickness and a layer of $SiO_2$ 300 nm in thickness were continuously sputtered on the gate electrode respectively as the gate insulation layer (3) and the second insulation layer (4) by the DC magnetism controlled sputtering method. The reactive sputtering conditions were as follows: a background vacuum of $2\times10^{-3}$ Pa; a $O_2$ pressure of 0.9 Pa; a DC power of 500 W; and a substrate temperature of 100 centigrade. Next, the photo-resist was coated, exposed and developed. Then a layer of Au 100 nm in thickness was formed by the method of heat evaporation at a vacuum of $10^{-5}$ Pa, using the photo-resist as the nozzle plate, to give a sample. The sample was placed into the solvent acetone in order to peel off the unwanted Au to form the source electrode (5) and the drain electrode (6). The resultant channel was 1000 micrometers in width and 100 micrometers in length. Then, a dry RIE process was performed to remove the part of $SiO_2$ layer, which was not covered by the source/drain electrode, using the source/drain electrode as a mask. The conditions for the dry RIE process were as follows: the flow rate of $SF_6$ gas was 50 SCCM, and the RF power was 100 W. Finally, the quartz boat containing CuPc powder was heated at a high vacuum of $10^{-5}$ Pa so that the CuPc powder was sublimated onto the substrate to form a semiconductor active layer 300 nm in thickness, which was then shaped into an island (7) by photolithography and a dry RIE process. The conditions for the dry RIE were as follows: the flow rate of $O_2$ gas was 100 SCCM, and the RF power was 100 W. Thus a transistor was formed. When the bias voltage on the gate electrode was −50V, the on-state current of the transistor was 6 $\mu$A. And the switching current ratio was over $10^4$ (See FIG. 7).

EXAMPLE 2

As shown in FIG. 6, a layer of alloy MoW was plated on the flexible plastic substrate (1) by co-sputtering target Mo and W using the RF magnetism controlled sputtering method. The sputtering conditions are as follows: a background vacuum of $2\times10^{-3}$ Pa; a Ar pressure of 1 Pa; a RF power of 500 W; and a substrate temperature of 100 centigrade. Then the layer of metal Ta was shaped into the gate electrode (2) by the photolithography method. A layer of $Ta_2O_5$ 500 nm in thickness was sputtered on the gate electrode as the gate insulation layer (3) by the DC magnetism controlled sputtering method. The reactive sputtering conditions were as follows: a background vacuum of $2\times10^{-3}$ Pa; a $O_2$ pressure of 0.9 Pa; a DC power of 500 W; and a substrate temperature of 100 centigrade. Subsequently, a layer of poly(methyl methacrylate) (PMMA) 300 nm in thickness was spin coated as the second insulation layer (4). Next, the photo-resist was coated, exposed and developed. Then a layer of silver (Ag) 100 nm in thickness was formed by the method of heat evaporation at a vacuum of $10^{-5}$ Pa, using the photo-resist as the nozzle plate, to give a sample. The sample was placed into the solvent acetone in order to peel off the unwanted Ag to form the source electrode (5) and the drain electrode (6). The resultant channel was 1000 micrometers in width and 100 micrometers in length. Then, a dry RIE process was performed to remove the part of PMMA layer, which was not covered by the source/drain electrode, using the source/drain electrode as a mask. The conditions for the dry RIE process were as follows: the flow rate of $O_2$ gas was 50 SCCM, and the RF power was 100 W. Finally, the quartz boat containing NiPc powder was heated at a high vacuum of $10^{-5}$ Pa so that the NiPc powder was sublimated onto the substrate to form a semiconductor active layer 400 nm in thickness, which was then shaped into an island (7) by photolithography and a dry RIE process. The conditions for the dry RIE were as follows: the flow rate of $O_2$ gas was 100 SCCM, and the RF power was 100 W. Thus a transistor was formed. When the bias voltage on the gate electrode was −50V, the on-state current of the transistor was 2 $\mu$A. And the switching current ratio was over $10^4$.

EXAMPLE 3

As shown in FIG. 6, a layer of metal Cr was plated on the flexible plastic substrate (1) by sputtering target Cr using the RF magnetism controlled sputtering method. The sputtering conditions are as follows: a background vacuum of $2\times10^{-3}$ Pa; a Ar pressure of 1 Pa; a RF power of 500 W; and a substrate temperature of 100 centigrade. Then the layer of metal Ta was shaped into the gate electrode (2) by the photolithography method. A layer of $TiO_2$ 500 nm in thickness was sputtered on the gate electrode as the gate insulation layer (3) by the DC magnetism controlled sputtering method. The reactive sputtering conditions were as follows: a background vacuum of $2\times10^{-3}$ Pa; a $O_2$ pressure of 0.9 Pa; a DC power of 500 W; and a substrate temperature of 100 centigrade. Subsequently, a layer of polyimide 300 nm in thickness was spin coated as the second insulation layer (4). Next, a layer of silver (Al) 100 nm in thickness was formed by the method of heat evaporation at a vacuum of $10^{-5}$ Pa. Then, the photo-resist was coated, exposed and developed. After that, the source electrode (5) and the drain electrode (6) were formed by photolithography method. The resultant channel was 1000 micrometers in width and 100 micrometers in length. Then, a dry RIE process was performed to remove the part of polyimide layer, which was not covered by the source/drain electrode, using the source/drain electrode as a mask. The conditions for the dry RIE process were as follows: the flow rate of $O_2$ gas was 50 SCCM, and the RF power was 100 W. Finally, the quartz boat containing $F_{16}CuPc$ powder was heated at a high vacuum of $10^{-5}$ Pa so that the $F_{16}CuPc$ powder was sublimated onto the substrate to form a semiconductor active layer 400 nm in thickness, which was then shaped into an island (7) by photolithography and a dry RIE process. The conditions for the dry RIE were as follows: the flow rate of $O_2$ gas was 100 SCCM, and the RF power was 100 W. Thus a transistor was formed. When the bias voltage on the gate electrode was −50V, the on-state current of the transistor was 8 μA. And the switching current ratio was over $10^5$.

The present invention has been described by way of the above examples but is not limited to the modes described in the respective examples. In general, the organic transistor according to the present invention can be processed to the elements of the 2D and 3D integrated devices. These integrated devices can be applied in flexible IC, the active matrix display and the like. The organic transistor according to the present invention can be processed at low temperature. Besides the traditional photolithography, many methods such as softlithography, printing and the like can be used to prepare the organic transistor of the present invention.

What is claimed is:

1. An organic thin film transistor (OTFT), comprising:
   a substrate (1);
   a gate electrode (2) formed on the substrate (1);
   a gate insulation layer formed on the gate electrode;
   a source electrode (5) and a drain electrode (6) formed on the gate insulation layer including a first insulation layer (3) and a second insulation layer (4) with different dielectric constants, wherein the first insulation layer and the substrate make contact, and the region comprising the source electrode and the drain electrode is separated from the first insulation layer by the second insulation layer; and
   an organic semiconductor layer (7) which overlays the source electrode (5) and the drain electrode (6).

2. The organic thin film transistor according to claim 1, wherein the dielectric constant of the first insulation layer (3) is higher than that of the second insulation layer (4).

3. The organic thin film transistor according to claim 2, wherein the dielectric constant of the first insulation layer (3) is at least three times higher than that of the second insulation layer (4).

4. The organic thin film transistor according to claim 1, wherein the first insulation layer (3) is selected from a group consisting of organic, inorganic and ferroelectric material.

5. The organic thin film transistor according to claim 4, wherein the organic material is polyvinylidene fluoride.

6. The organic thin film transistor according to claim 4, wherein the inorganic material is a metal oxide selected from a group consisting of $Ta_2O_5$, $Al^2O_3$ and $TiO_2$.

7. The organic thin film transistor according to claim 4, wherein the ferroelectric material is barium titanate.

8. The organic thin film transistor according to claim 4, wherein the second insulation layer (4) is made of organic polymer material or inorganic material.

9. The organic thin film transistor according to claim 8, wherein the organic polymer material is poly(methyl methacrylate), polyimide or epoxide resin.

10. The organic thin film transistor according to claim 8, wherein the inorganic material is $SiO_2$ or $SiN_x$.

11. The organic thin film transistor according to claim 1, wherein the organic semiconductor layer (7) is made of N-type or P-type semiconductor material.

12. The organic thin film transistor according to claim 11, wherein the N-type semiconductor material is selected from a group consisting of $F_{16}CuPc$, $F_{16}CrPc$, $F_{16}ZnPc$, $F_{16}H_2PC$, the mixtures thereof, and the eutectics thereof.

13. The organic thin film transistor according to claim 11, wherein the P-type semiconductor material is selected from a group consisting of CuPc, NiPc, ZnPc, $H_2Pc$, the mixtures thereof, and the eutectics thereof.

14. The organic thin film transistor according to claim 1, wherein the organic semiconductor layer (7) is made of a polymer material.

15. The organic thin film transistor according to claim 14, wherein the polymer material is polythiophene.

16. The organic thin film transistor according to claim 1, wherein the substrate is a glass substrate.

17. The organic thin film transistor according to claim 1, wherein the substrate is a flexible plastic substrate.

* * * * *